United States Patent
Son

(10) Patent No.: US 9,373,366 B2
(45) Date of Patent: Jun. 21, 2016

(54) NONVOLATILE MEMORY DEVICE AND METHOD OF OPERATING THE SAME

(71) Applicant: SK hynix Inc., Gyeonggi-do (KR)

(72) Inventor: Yeong-Joon Son, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/632,820

(22) Filed: Feb. 26, 2015

(65) Prior Publication Data

US 2016/0133302 A1 May 12, 2016

(30) Foreign Application Priority Data

Nov. 6, 2014 (KR) ........................ 10-2014-0153561

(51) Int. Cl.
*G11C 5/14* (2006.01)
(52) U.S. Cl.
CPC ...................................... *G11C 5/148* (2013.01)
(58) Field of Classification Search
USPC ................................................. 365/193, 226
See application file for complete search history.

(56) References Cited

U.S. PATENT DOCUMENTS

| 5,774,409 | A | * | 6/1998 | Yamazaki | ............ | G06F 12/0215 365/230.03 |
| 7,696,795 | B2 | * | 4/2010 | Choi | .................... | H03K 17/223 327/142 |
| 2007/0182474 | A1 | * | 8/2007 | Von Thun | .............. | H03H 11/26 327/276 |
| 2009/0045792 | A1 | * | 2/2009 | Sugawara | ............. | H02J 7/0031 323/282 |
| 2009/0154237 | A1 | * | 6/2009 | Tokiwa | ................ | G11C 7/1078 365/185.03 |
| 2009/0167532 | A1 | * | 7/2009 | Kang | ................. | G06K 19/0723 340/572.1 |
| 2010/0194453 | A1 | * | 8/2010 | Kadowaki | ............ | H03K 17/223 327/143 |
| 2011/0255353 | A1 | * | 10/2011 | Fukushima | ........ | G01R 31/2874 365/191 |

FOREIGN PATENT DOCUMENTS

KR       1020080065069        7/2008

* cited by examiner

*Primary Examiner* — Huan Hoang
*Assistant Examiner* — Pablo Huerta
(74) *Attorney, Agent, or Firm* — IP & T Group LLP

(57) ABSTRACT

A nonvolatile memory device may include a power-on reset signal generation unit suitable for receiving a power supply voltage, and generating a power-on reset signal that changes based on the power supply voltage, and a discharging signal generation unit suitable for generating a discharging signal for discharging a word line to be activated earlier than an activation timing of the power-on reset signal when the power supply voltage decreases.

15 Claims, 3 Drawing Sheets

NONVOLATILE MEMORY DEVICE AND METHOD OF OPERATING THE SAME

CROSS-REFERENCE TO RELATED APPLICATIONS

The present application claims priority of Korean Patent Application No. 10-2014-0153561, filed on Nov. 6, 2014, which is incorporated herein by reference in its entirety.

BACKGROUND

1. Field

Exemplary embodiments of the present invention relate to a semiconductor design technology, and more particularly, to a nonvolatile memory device including a power-on reset circuit, and a method of operating the same.

2. Description of the Related Art

Semiconductor memory devices are generally classified into volatile and nonvolatile memory devices. Volatile memory devices have an advantage in that read and write speeds are fast, but are disadvantaged in that stored content is not retained when external power is interrupted. Nonvolatile memory devices have an advantage in that stored content is retained even without external power. Accordingly, nonvolatile memory devices are used to store content that needs to be retained without a constant source of power.

A semiconductor memory device receives its power supply voltage from an internal or external power supply. When the power supply is suddenly interrupted (hereinafter, referred to as "sudden power-off; SPO"), a defect may occur, such as loss of data being programmed in the semiconductor memory device. Accordingly, in a sudden power-off, in order to stably retain data, a word line and a bit line are discharged. For such an operation, a discharging signal for discharging the word line and the bit line may be generated by detecting the power supply voltage that is supplied from the power supply.

A general semiconductor memory device includes a power-on reset (POR) circuit to prevent abnormal' operations when power is supplied thereto. When the power supply voltage reaches a predetermined level after the power is supplied to the semiconductor memory device, the power-on reset circuit provides a reset signal for initializing a flip-flop, a latch, a counter, a register or the like. In general, when the power supply voltage reaches a predetermined level after power-on, the power-on reset circuit activates the reset signal. If the power supply voltage reaches a normal operation voltage, the power-on reset circuit deactivates the reset signal. In response to the activated reset signal, internal elements of the semiconductor memory device are reset to an initial state. Such a power-on reset circuit may also detect the level of the external power supply voltage and generate a power-on reset signal.

FIG. 1 is a circuit diagram illustrating a power-on reset signal generation unit and a discharging signal generation unit according to the prior art.

Referring to FIG. 1, a power-on reset signal generation unit 110 may include a PMOS transistor P1, a resistor R1, and a voltage level detection section 111.

The PMOS transistor P1 has a source coupled to an external power supply voltage (VCCE) terminal and a gate coupled to a ground voltage (VSS) terminal, and the resistor R1 is coupled between drain of the PMOS transistor P1 and the VSS terminal. When the PMOS transistor P1 is turned on, an external power supply voltage VCCE may be supplied to the power-on reset signal generation unit 110.

The voltage level detection section 111 may stably output an power-on reset signal POR when a voltage level of the external power supply voltage VCCE is equal to or greater than a preset level during power-on or is equal to or less than the preset level during power-down, after power-on.

A discharging signal generation unit 120 may include a resistor R2 and R3, a voltage level detection section 121 and an OR gate 122.

The resistor R2 is coupled between external power supply voltage VCCE terminal and the resistor R3, and the resistor R3 is coupled between the resistor R2 and the ground terminal VSS terminal.

The voltage level detection section 121 may stably output an internal discharging signal INT_DTVCC. The OR gate 122 may perform a logic operation on the internal discharging signal INT_DTVCC and the power-on reset signal POR, thereby outputting a discharging signal DTVCC.

The power-on reset signal generation unit 110 and the discharging signal generation unit 120 may generate a power-on reset signal POR and a discharging signal DTVCC, respectively, based on an external power supply voltage VCCE. In other words, the power-on reset signal generation unit 110 and the discharging signal generation unit 120 may generate the discharging signal DTVCC and the power-on reset signal POR to be used in a sudden power-off by detecting the voltage level of the external power supply voltage VCCE. When the discharging signal DTVCC and the power-on reset signal POR are generated, the discharging signal DTVCC has to be generated earlier than the power-on reset signal POR. When powering-off (reducing the voltage level) of the external power supply voltage VCCE, the detection level of the discharging signal DTVCC may be set to be higher than the detection level of the power-on reset signal POR. However, a PMOS transistor P1 used in the power-on reset signal generation unit 110 is very sensitive to changes in skew, such as temperature or resistance. Due to the change in skew, a reversal phenomenon in which the power-on reset signal POR is generated earlier than the discharging signal DTVCC may occur. This concern is illustrated in FIG. 2.

FIG. 2 is a timing diagram illustrating a reversal phenomenon of the power-on reset signal according to the prior art.

Referring to FIG. 1 and FIG. 2, in the sudden power-off in which the supply of the external power supply voltage VCCE is suddenly interrupted, since the discharging signal DTVCC has to be generated earlier than the power-on reset signal POR, the detection level of the discharging signal DTVCC is higher than the detection level of the power-on reset signal POR. However, depending on the change in skew of the PMOS transistor P1 provided in the power-on reset signal generation unit 110, a reversal phenomenon in which the power-on reset signal POR is generated earlier than the discharging signal DTVCC may occur. When the reversal phenomenon occurs, since a word line is initialized by the power-on reset signal POR before being discharged, it is difficult to stably retain data stored in a cell.

Due to such concerns, the detection level of the discharging signal DTVCC may be set to be higher than the detection level of the power-on reset signal POR. The detection level of the discharging signal DTVCC may be set from 2 V to 1.8 V and the detection level of the power-on reset signal POR may be set from 1.7 V to 1.4 V. For example, when the detection level of the discharging signal DTVCC is set to 2 V, the external power supply voltage VCCE may suddenly drop due to excessive current consumption by an internal operation. In such case, it may be detected as a sudden power-off and the discharging signal DTVCC may be activated. Therefore, as illustrated in FIG. 2, a low VCCE margin has to be kept in order to cope with the drop phenomenon.

In brief, when the difference between the detection levels of the discharging signal DTVCC and the power-on reset signal POR is small, an abnormal operation may occur due to the reversal phenomenon caused by a change in skew of the power-on reset signal POR. Furthermore, when the detection level of the discharging signal DTVCC is set high, the discharging signal DTVCC may be activated by the drop phenomenon, resulting in the occurrence of an abnormal operation.

SUMMARY

Various embodiments are directed to a nonvolatile memory device capable of controlling a discharging signal for discharging a word line to be activated earlier than the activation timing of a power-on reset signal to protect cell data in a sudden power-off.

In an embodiment, a nonvolatile memory device may include: a power-on reset signal generation unit suitable for receiving a power supply voltage, and generating a power-on reset signal that changes based on a level of the power supply voltage; and a discharging signal generation unit suitable for generating a discharging signal for discharging a word line to be activated earlier than an activation timing of the power-on reset signal when the power supply voltage decreases.

The power-on reset signal generation unit may include a voltage level detection section suitable for detecting the level of the power supply voltage, and outputting an internal power-on reset signal when the detected level reaches a predetermined level, and a delay section suitable for delaying a first edge of the internal power-on reset signal for a given time when the power supply voltage decreases.

The voltage level detection section may output the internal' power-on reset signal when the detected level is equal to or greater than a preset level during power-on, and output the internal power-on reset signal when the detected level is equal to or less than the preset level during power-down.

The voltage level detection section may include a Schmitt trigger circuit that controls the internal power-on reset signal to be stably outputted when noise occurs in the power supply voltage.

The discharging signal generation unit may include an internal discharging signal generation section suitable for generating an internal discharging signal in response to the internal power-on reset signal and an output signal of the delay section, and a discharging signal output section suitable for outputting the discharging signal in response to the internal discharging signal and the power-on reset signal.

In an embodiment, a method of operating a nonvolatile memory device may include: receiving a power supply voltage; generating an internal power-on reset signal when the power supply voltage reaches a predetermined level; generating a discharging signal for discharging a word line in response to the internal power-on reset signal when the power supply voltage decreases; and delaying a first edge of the power-on reset signal for a given time and outputting the delayed signal as a power-on reset signal.

The generating of the internal power-on reset signal may include detecting a voltage level of the power supply voltage during power-on, and outputting the internal power-on reset signal when the detected voltage level is equal to or greater than a preset level.

The generating of the internal power-on reset signal may include detecting a voltage level of the power supply voltage during power-down, and outputting the internal power-on reset signal when the detected voltage level is equal to or less than a preset level.

The first edgy may include a falling edge.

In an embodiment, a method of operating a nonvolatile memory device may include receiving a power supply voltage, and generating a power-on reset signal that changes based on a level of the power supply voltage, and generating a discharging signal for discharging a word line at a time point earlier than an activation timing of the power-on reset signal when the power supply voltage decreases.

The generating of the power-on reset signal may include detecting the level of the power supply voltage, and outputting an internal power-on reset signal when the power supply voltage reaches a predetermined level; and delaying a first edge of the internal power-on reset signal for a given time when the power supply voltage decreases.

The outputting of the internal power-on reset signal may include outputting the internal power-on reset signal when the power supply voltage is equal to or greater than a preset level during power-on, and outputting the internal power-on reset signal when the power supply voltage is equal to or less than the preset level during power-down.

The generating of the discharging signal may include generating an internal discharging signal based on the internal power-on reset signal and a delay signal, which is generated by delaying the first edge of the internal power-on reset signal for the given time when the power supply voltage decreases; and outputting the discharging signal based on the internal discharging signal and the power-on reset signal.

In an embodiment, a nonvolatile memory device may include a voltage level detection unit suitable for generating an internal power-on reset signal when a power supply voltage reaches a predetermined level, a delay unit suitable for outputting a power-on reset signal by delaying a first edge of the internal power-on reset signal for a given time, and a discharging signal generation unit suitable for generating a discharging signal for discharging a word line based on the internal power-on reset signal when the power supply voltage decreases.

The voltage level detection unit may output the internal power-on reset signal when the power supply voltage is equal to or greater than a preset level during power-on, and outputs the internal power-on reset signal when the power supply voltage is equal to or less than the preset level during power-down.

The voltage level detection unit may include a Schmitt rigger circuit.

The discharging signal generation unit may include a signal' generation unit suitable for generating an internal discharging signal' based on the internal power-on reset signal and an output signal of the delay unit; and a signal output unit suitable for outputting the discharging signal based on the internal discharging signal and the power-on reset signal.

The discharging signal may be activated earlier than an activation timing of the power-on reset signal when the power supply voltage decreases.

The first edge may include a falling edge.

In accordance with the nonvolatile memory device according to an embodiment of the present invention, a discharging signal is activated earlier than a power-on reset signal in a sudden power-off, so that it is possible to stably discharge a word line and protect data.

DETAILED DESCRIPTION

Figure 1:
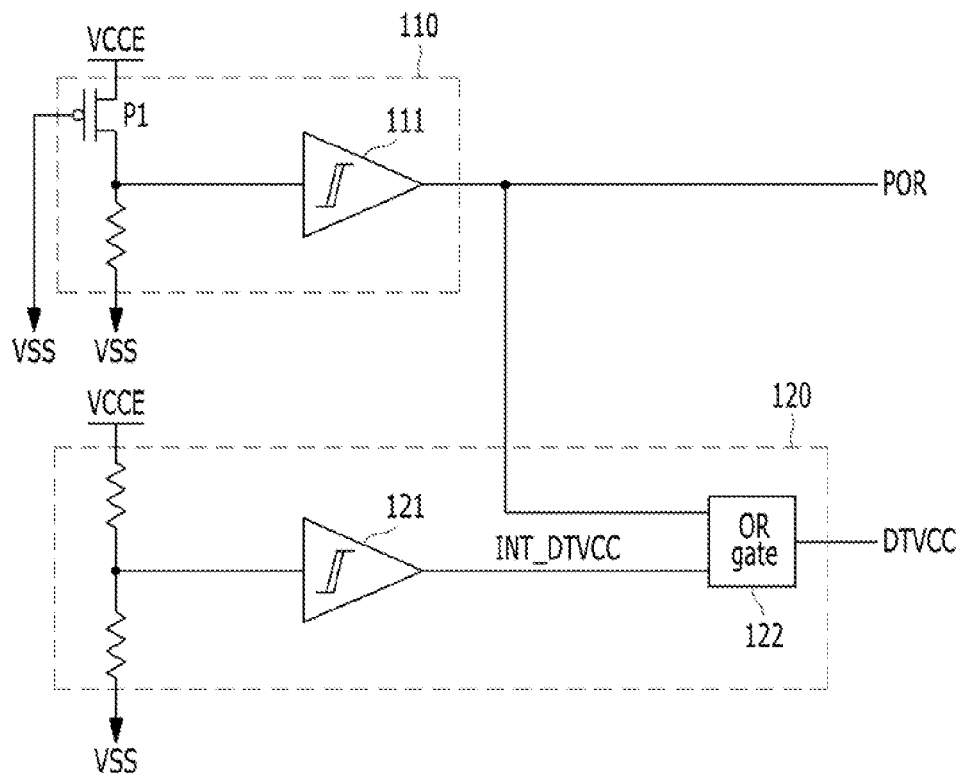
FIG. 1 is a circuit diagram illustrating a power-on reset signal generation unit and a discharging signal generation unit according to the prior art.
Figure 2:
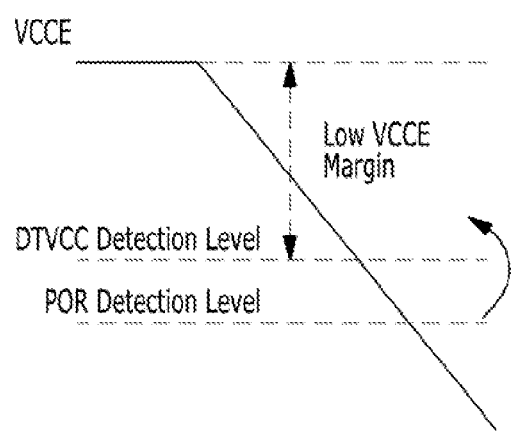
FIG. 2 is a timing diagram illustrating a reversal phenomenon of a power-on reset signal according to the prior art.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Figure 3:
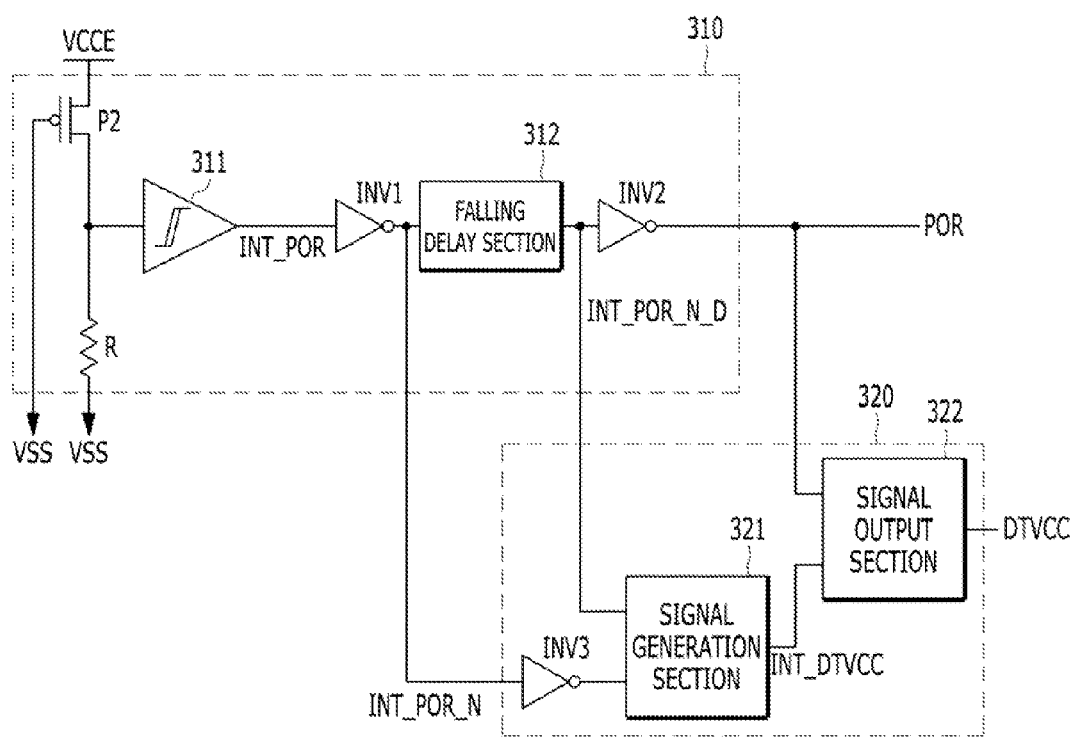
FIG. 3 is a circuit diagram illustrating a nonvolatile memory device in accordance with an embodiment of the present invention.

FIG. 3 is a circuit diagram illustrating a nonvolatile memory device in accordance with an embodiment of the present invention.

Referring to FIG. 3, the nonvolatile memory device may include a power-on reset signal generation unit 310 and a discharging signal generation unit 320.

The power-on reset signal generation unit 310 may include a PMOS transistor P2, a resistor R, a voltage level detection section 311, and a falling delay section 312.

The PMOS transistor P2 has a source coupled to an external power supply voltage (VCCE) terminal and a gate coupled to a ground voltage (VSS) terminal, and the resistor R is coupled between a drain of the PMOS transistor P2 and the VSS terminal. When the PMOS transistor P2 is turned on, an external power supply voltage VCCE may be supplied to the power-on reset signal generation unit 310.

The voltage level detection section 311 may stably output an Internal power-on reset signal INT_POR when a voltage level of the external power supply voltage VCCE is equal to or greater than a preset level during power-on, or is equal to or less than the preset level during power-down, after power-on. In other words, as the voltage level of the external power supply voltage VCCE increases or decreases, the voltage level detection section 311 may control the internal power-on reset signal INT_POR to increase or decrease in proportion to the external power supply voltage VCCE. During power-on, as the voltage level of the external power supply voltage VCCE increases, the internal power-on reset signal INT_POR may increase, and during power-down, as the voltage level of the external power supply voltage VCCE decreases, the internal power-on reset signal INT_POR may decrease. Furthermore, since noise may be loaded on the external power supply voltage VCCE, the voltage level detection section 311 may be implemented with a Schmitt trigger circuit tolerant to noise. That is, the voltage level detection section 311 may prevent the internal power-on reset signal INT_POR from being activated due to the noise loaded on the external power supply voltage VCCE. Accordingly, it is possible to prevent an abnormal operation.

The falling delay section 312 may delay a falling edge of an inverted power-on reset signal INT_POR_N, which is an inverted signal of the internal power-on reset signal INT_POR, for a given time to output a delay signal INT_POR_N_D. Here, a first inverter INV1 may be disposed between the voltage level detection section 311 and the falling delay section 312, and a second Inverter INV2 may be disposed between the falling delay section 312 and an output node. The first inverter INV1 may invert the internal power-on reset signal INT_POR outputted from the voltage level detection section 311 to output the power-on reset signal INT_POR_N to the falling delay section 312. The second inverter INV2 may invert the delay signal INT_POR_N_D outputted from the falling delay section 312 to output a power-on reset signal POR at the output node. In other words, the falling delay section 312 may delay the falling edge of the inverted power-on reset signal INT_POR_N for the given time without delaying a rising edge of the inverted power-on reset signal INT_POR_N, thereby outputting the delay signal INT_POR_N_D.

In the nonvolatile memory device in accordance with the embodiment of the present invention, the falling edge is delayed to generate the power-on reset signal POR; however, a rising delay circuit for delaying a rising edge may be used to generate the power-on reset signal POR.

The discharging signal generation unit 320 may include a third inverter INV3, a signal generation section 321, and a signal output section 322. The third inverter INV3 may invert the inverted power-on reset signal INT_POR_N. The signal generation section 321 may perform a logic operation on an inverted signal of the inverted power-on reset signal INT_POR_N which is outputted from the third inverter INV3, and the delay signal INT_POR_N_D outputted from the falling delay section 312, thereby generating an internal discharging signal INT_DTVCC. The signal generation section 321 may include an AND gate. The signal output section 322 may perform a logic operation on the internal discharging signal INT_DTVCC and the power-on reset signal POR, thereby outputting a discharging signal DTVCC. The signal output section 322 may include an OR gate.

As the generated discharging signal DTVCC is activated, the nonvolatile memory device may normally discharge a word line during a sudden power-off, wherein the voltage level of the external power supply voltage VCCE decreases.

In brief, when the power-on reset signal POR and the discharging signal DTVCC are generated in response to the internal power-on reset signal INT_POR generated by the power-on reset signal generation unit 310, the discharging signal DTVCC may be generated earlier than the power-on reset signal POR although there is a change in skew. A detailed description thereof will be given with reference to FIG. 4.

Figure 4:
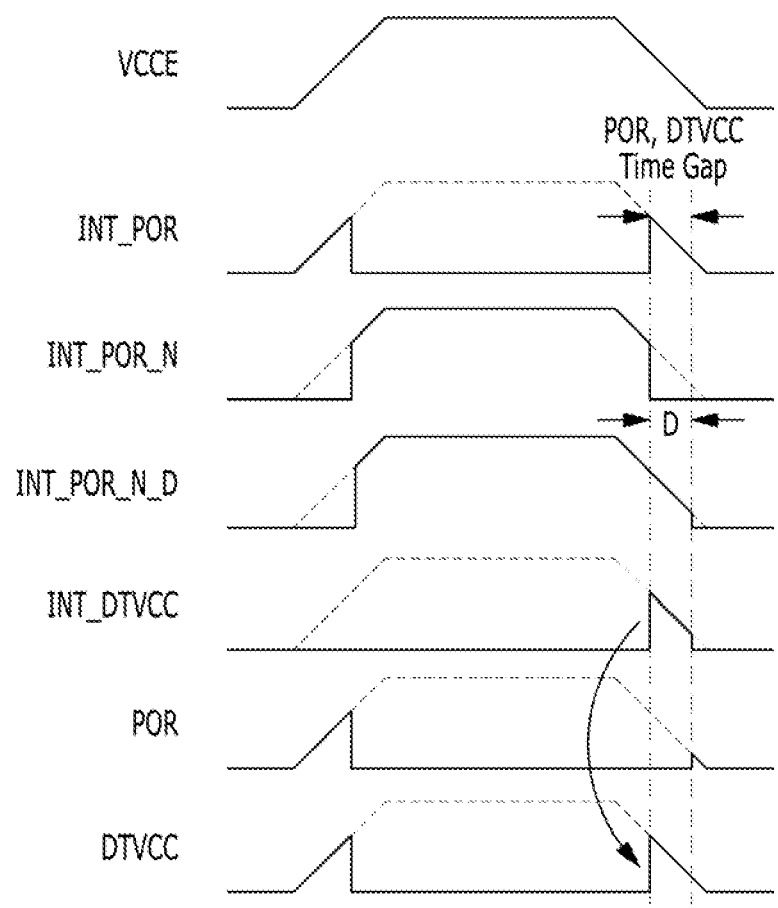
FIG. 4 is a timing diagram illustrating an operation of the nonvolatile memory device illustrated in FIG. 3.

FIG. 4 is a timing diagram illustrating an operation of the nonvolatile memory device illustrated in FIG. 3.

Referring to FIG. 3 and FIG. 4, when power is on and the external power supply voltage VCCE is ramped up, i.e., the voltage level of the external power supply voltage VCCE increases, the internal power-on reset signal INT_POR outputted from the power-on reset signal generation unit 310 increases in proportion to the voltage level of the external power supply voltage VCCE. Accordingly, the voltage levels of the power-on reset signal POR and the discharging signal DTVCC may increase in proportion to the voltage level of the external power supply voltage VCCE. In the ramp-up situation, since the external power supply voltage VCCE has not been applied completely, internal circuits may not operate stably. Therefore, the discharging signal DTVCC and the power-on reset signal POR may simultaneously ramp up, but it has no influence on the nonvolatile memory device.

After the power-on, in a sudden power-off in which the external power supply voltage VCCE is stably applied and then the voltage level of the external power supply voltage VCCE decreases, the voltage level detection section 311 outputs the internal power-on reset signal INT_POR to be activated once more when the voltage level of the external power supply voltage VCCE is equal to or less than a preset level. Then, the first inverter INV1 inverts the internal power-on reset signal INT_POR to output the inverted power-on reset signal INT_POR_N to the falling delay section 312 and the discharging signal generation unit 320. The falling delay section 312 delays the falling edge of the inverted power-on reset signal INT_POR_N for the given time 'D' to output the delay signal INT_POR_N_D, and the second inverter INV2 inverts the delay signal INT_POR_N_D to output the power-on reset signal POR.

The discharging signal generation unit 320 may generate the discharging signal DTVCC based on the inverted signal of the inverted power-on reset signal INT_POR_N, the delay signal INT_POR_N_D, and the power-on reset signal POR. In detail, the signal generation section 321 outputs an internal discharging signal INT_DTVCC by performing a logic operation on the inverted signal of the inverted power-on reset signal INT_POR_N and the delay signal INT_POR_N_D which is outputted from the falling delay section 312. The signal output section 322 outputs the discharging signal DTVCC for discharging a word line by performing a logic operation on the internal discharging signal INT_DTVCC and the power-on reset signal POR.

In other words, from the time point at which the internal discharging signal INT_DTVCC is activated, the discharging signal' DTVCC is activated to discharge a word line, and the power-on reset signal POR is activated after being delayed by a delay time 'D' of the falling delay section 312, which corresponds to an activation period of the internal discharging signal INT_DTVCC. That is, for the activation period of the internal discharging signal INT_DTVCC, the power-on reset signal POR may not be outputted.

As the delay time 'D' of the falling delay section 312 increases, the activation period of the internal discharging signal INT_DTVCC increases. Therefore, in the power-off, the power-on reset signal POR may not be activated, but this does not influence internal operations. This is because the power-on reset signal POR is necessary for the power-on and the discharging signal DTVCC is necessary for the power-off. Thus, in the sudden power-off, the falling delay section 312 may adjust a delay time such that the time necessary for discharging the word line is ensured. Consequently, even though the power-on reset signal POR is not activated, the internal circuit may normally perform an operation.

In brief, in order to stably discharge a word line in a sudden power-off, the nonvolatile memory device may allow the detection levels of the discharging signal DTVCC and the power-on reset signal POR to be substantially equal to each other and control the power-on reset signal POR to be activated after being delayed for a predetermined time such that the discharging signal DTVCC may be activated earlier than the power-on reset signal POR.

Consequently, in the sudden power-off, the discharging signal DTVCC is generated earlier than the power-on reset signal POR, so that it is possible to stably discharge a word line and protect data.

For such an operation, the nonvolatile memory device of the present invention may operate in the following method.

The nonvolatile memory device may operate by receiving a power supply voltage from outside, generating an internal power-on reset signal when the power supply voltage reaches a preset level, generating a discharging signal for discharging a word line in response to the internal power-on reset signal when the power supply voltage decreases, and delaying a first edge of the internal power-on reset signal for a given time and outputting the delayed signal as a power-on reset signal.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory device comprising:
   a power-on reset signal generation unit suitable for receiving a power supply voltage, and generating a power-on reset signal that changes based on the power supply voltage; and
   a discharging signal generation unit suitable for generating a discharging signal for discharging a word line that is activated earlier than an activation timing of the power-on reset signal when the power supply voltage decreases,
   wherein the power-on reset signal generation unit comprises:
   a voltage level detection section suitable for detecting the level of the power supply voltage, and outputting an internal power-on reset signal when the power supply voltage reaches a predetermined voltage, and
   wherein the voltage level detection section outputs the internal power-on reset signal when the power supply voltage is equal to or greater than a preset level during power-on, and outputs the internal power-on reset signal when the power supply voltage is equal to or less than the preset level during power-down.

2. The nonvolatile memory device of claim 1, wherein the power-on reset signal generation unit further comprises:
   a delay section suitable for delaying a first edge of the internal power-on reset signal for a given time when the power supply voltage decreases.

3. The nonvolatile memory device of claim 2, wherein the voltage level detection section includes a Schmitt trigger circuit that controls the internal power-on reset signal to be stably outputted when noise occurs in the power supply voltage.

4. The nonvolatile memory device of claim 2, wherein the discharging signal generation unit comprises:
   a signal generation section suitable for generating an internal discharging signal in response to the internal power-on reset signal and an output signal of the delay section; and
   a signal output section suitable for outputting the discharging signal in response to the internal discharging signal and the power-on reset signal.

5. A method of operating a nonvolatile memory device, the method comprising:
   receiving a power supply voltage;
   generating an internal power-on reset signal when the power supply voltage reaches a predetermined level;
   generating a discharging signal for discharging a word line in response to the internal power-on reset signal when the power supply voltage decreases; and
   delaying a first edge of the internal power-on reset signal for a given time and outputting the delayed signal as a power-on reset signal, wherein the generating of the internal power-on reset signal comprises:
detecting a voltage level of the power supply voltage during power-down; and
outputting the internal power-on reset signal when the detected voltage level is equal to or less than a preset level.

6. The method of claim 5, wherein the generating of the internal power-on reset signal comprises:
detecting the power supply voltage during power-on; and
outputting the internal power-on reset signal when the power supply voltage is equal to or greater than a preset level.

7. The method of claim 5, wherein the first edge includes a falling edge.

8. A method of operating a nonvolatile memory device, the method comprising:
receiving a power supply voltage, and generating a power-on reset signal that changes based on the power supply voltage; and
generating a discharging signal for discharging a word line to be activated earlier than an activation timing of the power-on reset signal when the power supply voltage decreases,
wherein the generating of the power-on reset signal comprises:
detecting the level of the power supply voltage, and outputting an internal power-on reset signal when the power supply voltage reaches a predetermined level, and
wherein the outputting of the internal power-on reset signal comprises:
outputting the internal power-on reset signal when the power supply voltage is equal to or greater than a preset level during power-on, and outputting the internal power-on reset signal when the power supply voltage is equal to or less than the preset level during power-down.

9. The method of claim 8, wherein the generating of the power-on reset signal further comprises:
delaying a first edge of the internal power-on reset signal for a given time when the power supply voltage decreases.

10. The method of claim 9, wherein the generating of the discharging signal comprises:
generating an internal discharging signal based on the internal power-on reset signal and a delay signal, which is generated by delaying the first edge of the internal power-on reset signal for the given time when the power supply voltage decreases; and
outputting the discharging signal based on the internal discharging signal and the power-on reset signal.

11. A nonvolatile memory device comprising:
a voltage level detection unit suitable for generating an internal power-on reset signal when a power supply voltage reaches a predetermined level;
a delay unit suitable for outputting a power-on reset signal by delaying a first edge of the internal power-on reset signal for a given time; and
a discharging signal generation unit suitable for generating a discharging signal for discharging a word line based on the internal power-on reset signal when the power supply voltage decreases,
wherein the voltage level detection unit outputs the internal power-on reset signal when the power supply voltage is equal to or greater than a preset level during power-on, and outputs the internal power-on reset signal when the power supply voltage is equal to or less than the preset level during power-down.

12. The nonvolatile memory device of claim 11, wherein the voltage level detection unit includes a Schmitt trigger circuit.

13. The nonvolatile memory device of claim 11, wherein the discharging signal generation unit comprises:
a signal generation unit suitable for generating an internal discharging signal based on the internal power-on reset signal and an output signal of the delay unit; and
a signal output unit suitable for outputting the discharging signal based on the internal discharging signal and the power-on reset signal.

14. The nonvolatile memory device of claim 11, wherein the discharging signal is activated earlier than an activation timing of the power-on reset signal when the power supply voltage decreases.

15. The nonvolatile memory device of claim 11, wherein the first edge includes a falling edge.

* * * * *